United States Patent [19]

Scholes et al.

[11] Patent Number: 5,781,011
[45] Date of Patent: Jul. 14, 1998

[54] DIELECTRIC RESONATOR-BASED ELECTRON PARAMAGNETIC RESONANCE PROBE

[75] Inventors: Charles P. Scholes, Delmar; Andrzej Sienkiewicz, Albany, both of N.Y.

[73] Assignee: The Research Foundation of State University of New York, Albany, N.Y.

[21] Appl. No.: 741,256

[22] Filed: Oct. 30, 1996

Related U.S. Application Data

[62] Division of Ser. No. 278,936, Jul. 22, 1994, Pat. No. 5,598,097.

[51] Int. Cl.$^6$ ............................................. G01V 3/00
[52] U.S. Cl. ................................. 324/316; 324/318
[58] Field of Search .............................. 324/316, 300, 324/318, 322, 321

[56] References Cited

U.S. PATENT DOCUMENTS

| | | | |
|---|---|---|---|
| 3,828,244 | 8/1974 | Hyde | 324/316 |
| 5,293,120 | 3/1994 | Gentsch et al. | 324/316 |
| 5,347,219 | 9/1994 | Gentsch et al. | 324/316 |

Primary Examiner—Louis M. Arana
Attorney, Agent, or Firm—Heslin & Rothenberg, P.C.

[57] ABSTRACT

An apparatus for use in electron paramagnetic spectroscopy having a resonant structure with one or more dielectric resonators, the resonant frequency of which may be varied by varying the distance between the dielectric resonators, the coupling between the coupler and resonant structure may be varied by a remote coupling matching device without changing the resonant frequency of the resonant structure.

12 Claims, 7 Drawing Sheets

DIELECTRIC RESONATOR-BASED ELECTRON PARAMAGNETIC RESONANCE PROBE

This application is a division of application Ser. No. 08/278,936 filed Jul. 22, 1994 which application is now U.S. Pat. No. 5,598,097.

The United States Government has a paid up nonexclusive license in this invention as provided by the terms of Grant No. 5R016M3510320 awarded by the National Institute of Health (NIH).

TECHNICAL FIELD

The present invention relates to an apparatus for practicing electron paramagnetic resonance spectroscopy, more particularly, to a dielectric resonator-based electron paramagnetic resonance probe having a tunable coupler.

BACKGROUND OF THE INVENTION

Electron paramagnetic resonance (EPR) has been used to make direct measurements of reaction kinetics, particularly for those reactions involving free radicals. Exemplary applications of stopped-flow EPR include studies of: the kinetics of enzymatic molecular oxygen consumption; kinetics of micromolar quantities of spin-trapped free radicals followed on a sub-second time scale; time resolved protein folding and unfolding; and oxygenation of various organic molecules as performed in research concerning the effects of free radicals in ischemia.

Many EPR spectrometers utilize a conventional cavity resonator similar to one described in Yamazaki et al., *J. Biol. Chem.*, 235, 2444 (1960). These resonators are characterized generally by a rectangular metallic structure or frame, the inside of which is a resonant cavity through which a capillary or flat cell may extend. These conventional cavity resonators are typically ill suited for the study of lossy dielectric samples, which includes most biologicals and solutions of free radicals. The sample volumes utilized by the conventional cavity resonators are measured by the milliliter. However, biological samples are often limited in supply which presents a particularly troublesome problem since employing a conventional cavity resonator to study transient processes usually requires large volumes of relatively concentrated material. Another problem arises from the failure of the conventional cavity resonator to effectively isolate the region of microwave electric field ($E_1$) from the region of microwave magnetic fields ($H_1$), the latter of which induces the desired EPR transitions. The inability to separate the $E_1$ and $H_1$ components is an important characteristic since the electric field may often interact with a sample to cause resonant frequency changes and Q losses (Q is the quality factor, either calculated as being $2\pi \times$ microwave energy stored by the device/energy dissipated per cycle of microwaves or calculated as the resonant frequency ($v_o$) of the device/the difference in frequency ($\Delta v$) obtained at the 3 dB half power absorbing points on the mode pattern of the device). This undesirable interaction between the sample and the $E_1$ component is especially pronounced with lossy dielectric samples.

A design more recently used today for continuous and stopped flow EPR is based on a loop gap resonator (LGR) as described in Hubbell et al. *Rev. Sci. Instrumen.*, 58, 1879 (1987). The standard design for an LGR utilizes a machined MACOR® ceramic block having two holes extending through the block, these holes are connected by a thin slit extending through said block, the interior of the holes and slit are plated with silver. Unlike the conventional cavity resonators the LGR utilizes a much smaller sample volume, however, due to the complex configuration of the LGR and its small components the LGR based EPR probe is typically susceptible to a significant loss of sensitivity with use. In addition, due to the configuration of the loop and gap areas of the LGR low Q is experienced due to electric field ($E_1$) interaction with lossy dielectric samples. In addition, due to the design of the LGR, flow and stopped-flow induced noise is a limiting factor when utilizing stopped flow technology since repetitive starting and stopping of the sample flow in the capillary is required. This forced movement within the capillary tube creates vibrations which effectively limit the sensitivity of the LGR. In addition, the structure of the LGR makes it difficult to assemble and disassemble the device. In the event any particular part becomes contaminated or worn, the ability to replace or repair any individual component takes considerable effort and often requires returning the part to the manufacturer. In addition, the use of delicate and complex machined parts results not only in less durable parts but in expensive replacement parts. Furthermore, variable capacitance coupling used in connection with the LGR probe often causes large resonance frequency changes when the coupling is changed. The resulting simultaneous coupling and frequency changes greatly complicate attaining critical coupling.

Many EPR spectroscopy systems, such as existing Bruker systems, which lack the GaAsFET amplifier often have significant difficulty in making their AFC (automatic frequency control) lock to a low Q resonator. This difficulty is more commonly experienced at low powers. Difficulty in obtaining an AFC lock may cause frequency drift, drift in AFC error voltage, uncertain admixture of absorption and dispersion and noise. A higher Q system makes it easier to obtain an AFC lock without GaAsFET amplifications.

Therefore there exists a need for an EPR probe having a high Q, in particular, one suitable for use in the study of highly lossy samples and that is also capable of maintaining a high Q value when studying such samples. In addition, there exists a need for an EPR probe which utilizes small sample volumes but is capable of withstanding the vibrations created by stopped flow techniques and capable of maintaining a high Q and its sensitivity. In addition, there exists a need for an EPR probe having a simple and durable design which is readily assembled and disassembled and capable of quick and inexpensive repair.

SUMMARY OF THE INVENTION

The shortcomings of the prior art are overcome and the aforementioned objects are achieved in accordance with the principles of the present invention, which may comprise an electron paramagnetic resonance probe having at least one dielectric resonator with a hole extending axially therethrough; the resonators are surrounded by a microwave shield also having a hole extending axially therethrough such that a capillary may extend through both the microwave shield and the one or more dielectric resonators; and a coupler wherein microwaves generated from a distant source are coupled to said resonator. The electron paramagnetic resonance probe may comprise a single cylindrical dielectric resonator or two or more cylindrical dielectric resonators disposed vertically in relation to one another and with each having a hole extending axially therethrough wherein a capillary tube may extend through the hole within said first and second dielectric resonators. A low loss dielectric spacer may be disposed between multiple dielectric resonators. The dielectric resonators may comprise a highly dielectric, but non-lossy, material.

The coupler of the present invention may comprise: a microwave transmission line; and an antenna, wherein said antenna is disposed adjacent the spacer and substantially equidistant from the first and second resonators. When a single resonator is utilized the antenna may be disposed adjacent to the single dielectric resonator. The coupler may further comprise a microwave transmission line and a nonlinearly shaped antenna within a plane perpendicular to the axis of said capillary.

The electron paramagnetic resonator may further comprise a coupling matching device having a center conductor connected to an antenna. The center conductor and microwave transmission line are electrically connected. The center conductor may extend into a metal sleeve in which a movable metallic plunger, sized to fit within the sleeve and having an opening extending axially through said plunger sized to accept the center conductor, may be moved axially within the sleeve thereby changing the electrical length of the coupling matching device.

DETAILED DESCRIPTION

The present invention relates to a durable and efficient dielectric resonator based EPR probe. In accordance with the invention the EPR probe may include a resonant structure, a coupler and a coupling matching device.

Figure 1:
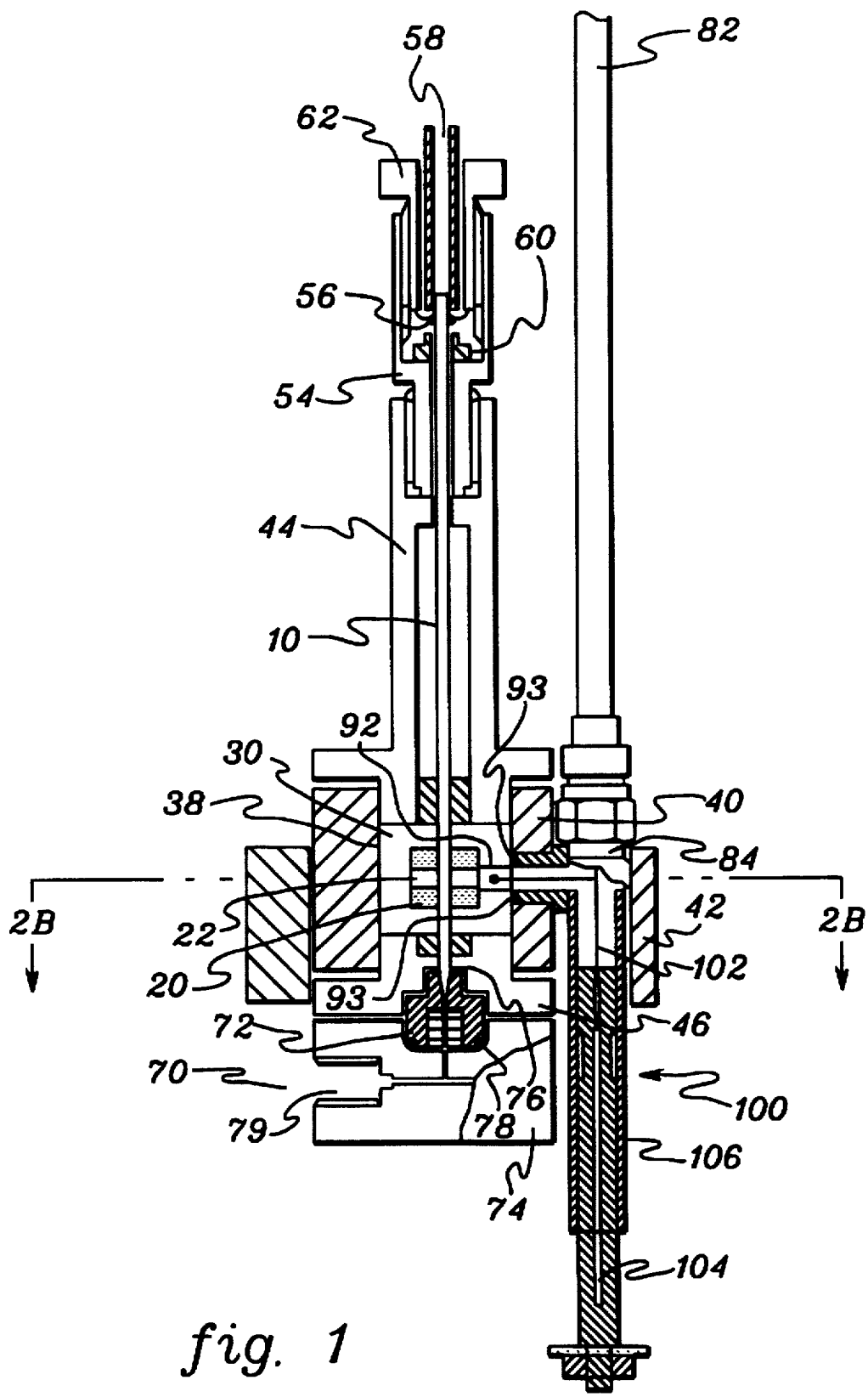
FIG. 1 is a partially cutaway side view of the dielectric resonator-based EPR probe.

As can be seen in reference to the embodiment shown in FIG. 1, the resonant structure may include a pair of dielectric resonators 20 separated by a low loss dielectric spacer 22 contained in a microwave shield 30 having a metallic covering 38. Surrounding the resonant structure may be a protective body 40 capable of accepting a mixer assembly 70 and capillary adapter 54. The resonant structure and protective body are designed such that a capillary 10 may extend from the mixer assembly 70 through the protective body 40 and resonant structure to the capillary adapter 54.

Extending from within the body of the microwave shield 30 of the resonant structure is an antenna 92. The antenna is a portion of the coupler which may comprise a microwave transmission line 82 connected to a microwave production source (not shown) and a connector 84. The antenna 92 protrudes laterally into the microwave shield 30 adjacent to the dielectric resonator 20 or spacer 22. The microwave transmission line 82 extends to and within the connector 84 which electrically connects the incoming microwave transmission line 82. semi-rigid coaxial cable 90 (which is connected to the antenna 92) and the center conductor 102 (which is part of the coupling matching device 100). The coupling matching device 100 may comprise a center conductor 102 and a tightly fitting metal plunger 104 surrounding a portion of the center conductor 102 both of which extend within tubing 106. The metal plunger 104 is capable of being moved back and forth along the length of the center conductor 102.

Figure 2:
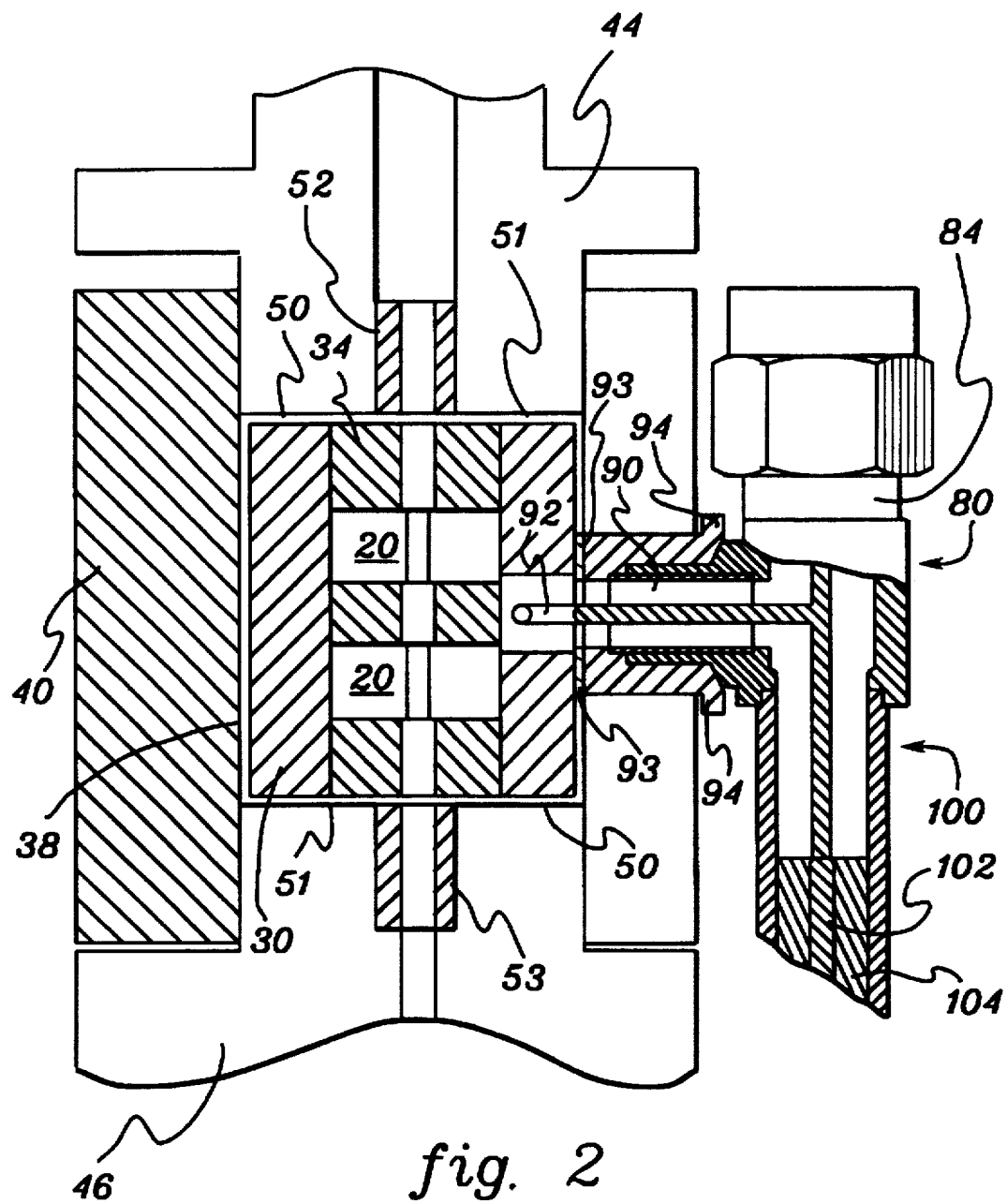
FIG. 2 is a partially cutaway side view of the resonator chamber, protective body and SMA connector.
Figure 3:
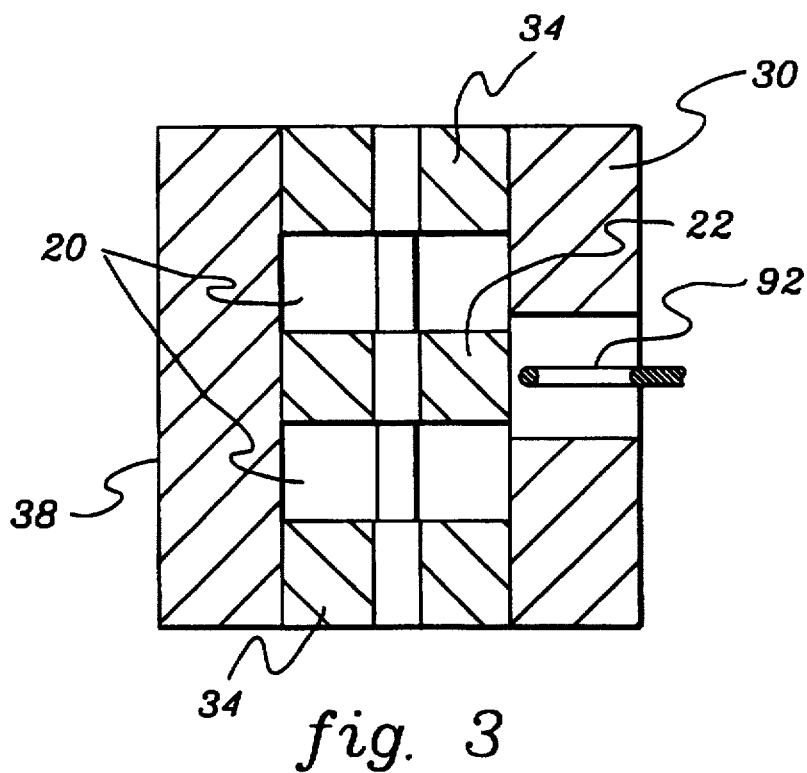
FIG. 3 is a cross-sectional side view of the resonant structure having two stacked dielectric resonators and antenna.
Figure 3B:
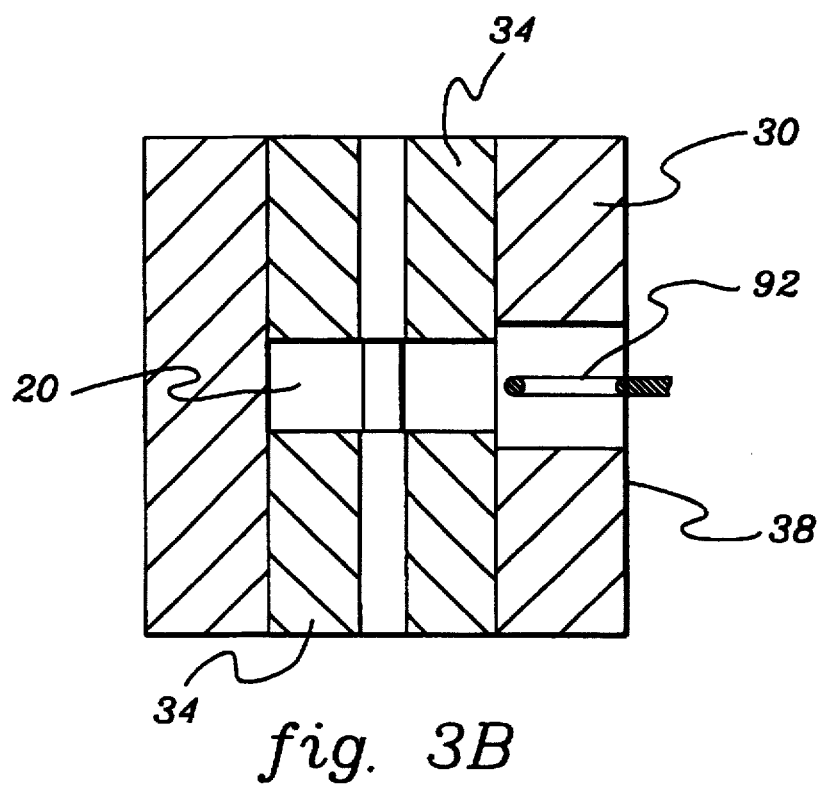
FIG. 3B is a cross-sectional view of the resonant structure having a single dielectric resonator and antenna.

As can be seen in FIGS. 3 and 3B the resonant structure may utilize one or more dielectric resonators 20, an optional spacer 22 and a microwave shield 30. The dielectric resonator 20 may be toroidal, cylindrical or rectangular in shape having a hole extending axially through the center. Preferably the dielectric resonator 20 is substantially disc shaped, the dimensions will vary as a function of the dielectric constant ($\epsilon$) of the material comprising the dielectric resonator and also upon the resonant frequency of the resonant structure. For X-band wavelengths with ceramics having a ($\epsilon$)≅30, the dimensions preferably include a dielectric resonator having an outer diameter (o.d.) 6.00 to 6.55 mm, inner diameter (i.d.) 1.00 to 3.00 mm and height 2.25 to 2.95 mm. The i.d. of the resonator should be large enough to allow the capillary 10 (FIG. 2) to extend therethrough. A common capillary used is fused quartz tubing 0.84 mm o.d., 0.60 mm i.d. and 100 mm in length. The dielectric resonator 20 is preferably comprised of a highly dielectric material having a dielectric constant greater than 10, with a preferred dielectric constant ($\epsilon$) greater than approximately 30, and a dielectric loss less than $1 \times 10^{-4}$, preferably under $8.0 \times 10^{-5}$. Examples of such dielectric materials include titanium oxide ceramics, examples being (ZrSn)Ti Oxide; BaLaTi Oxide; BaZnTaTi Oxide; Ba Ti Oxide. A preferred dielectric resonator is manufactured by MuRata-Erie North America, Inc., of State College, Pa., part number DRT060SO20CO27AM and Transtech Inc. of Adamstown, Md., part number C8733-0245-X-110-B-040. However, any appropriately sized and shaped dielectric material of low dielectric loss and containing no paramagnetic centers may function as a resonator in the present invention.

When multiple dielectric resonators 20 are utilized they may be separated by a low loss dielectric spacer 22 having a low dielectric constant ($\epsilon$). Preferably the spacer is comprised of a material having a $\epsilon<3$. Examples of such materials include, polystyrene, Rexolite®, Teflon®, KelF®. Rexolite® 1422 plastic manufacture by C-LEC Plastic, Inc. of Beverly, N.J. is a preferred material due to its low cost, easy machinability and good dielectric characteristics (no EPR background, a low dielectric loss of $6.6 \times 10^{-4}$ and a low dielectric constant of 2.53 at 10 GHz). Inexpensive and easily machinable products are preferred for use in the present invention as the specific size and shape of the individual spacers will vary with the desired resonant frequency ($f_o$). Preferably the spacer 22 is shaped to have the same outer and inner diameter of the dielectric resonators it is placed between, however, the preferred length will ultimately be dictated by the desired $f_o$.

Surrounding the top, bottom and sides of the dielectric resonator 20 and the optional spacer 22 is a microwave shield 30, which together with the resonators 20 comprise the resonant structure. The microwave shield 30 also prevents unwanted radiation losses and noise from the dielectric resonators and active volume of the sample capillary. The microwave shield 30 may comprise a body of low loss dielectric material, such as that utilized in the spacer. The low loss dielectric body preferably has a thickness of at least 10 mm. The outer surface of the microwave shield 30 has a metallic covering 38 capable of acting as a shield. Examples of such metallic coatings include: silver paint, gold paint, copper coatings including copper foil; copper, silver or gold electrolytic plating.

As can be seen in FIGS. 2 and 3, one embodiment of the microwave shield 30 may comprise low loss dielectric lids 34 sized to have the same outer and inner diameter of the dielectric resonators 20 and shaped to lie flat upon the resonators 20. These lids 34 are placed on the top and bottom portions of the dielectric resonator 20 (FIG. 3) or the exposed top and bottom portions opposite the spacer 22 (FIG. 2). The dielectric resonators 20, the spacer 22 and top and bottom lids 34 are contained within the microwave shield 30 which comprises a cylindrical side wall having an opening extending axially therethrough and sized to accept these components. The cylindrical side wall, 3.34 mm thick as show in FIG. 1, has an opening adjacent to a single resonator 20 (FIG. 3B) or spacer 22 (FIG. 3) large enough to accept the antenna 92 and has an outer surface coated with 0.05 mm of a silver coating such as DuPont® silver paint. Copper foil 50 (FIG. 2) is placed along the top and bottom of the cylindrical side wall and lids.

Figures 4, 4B:
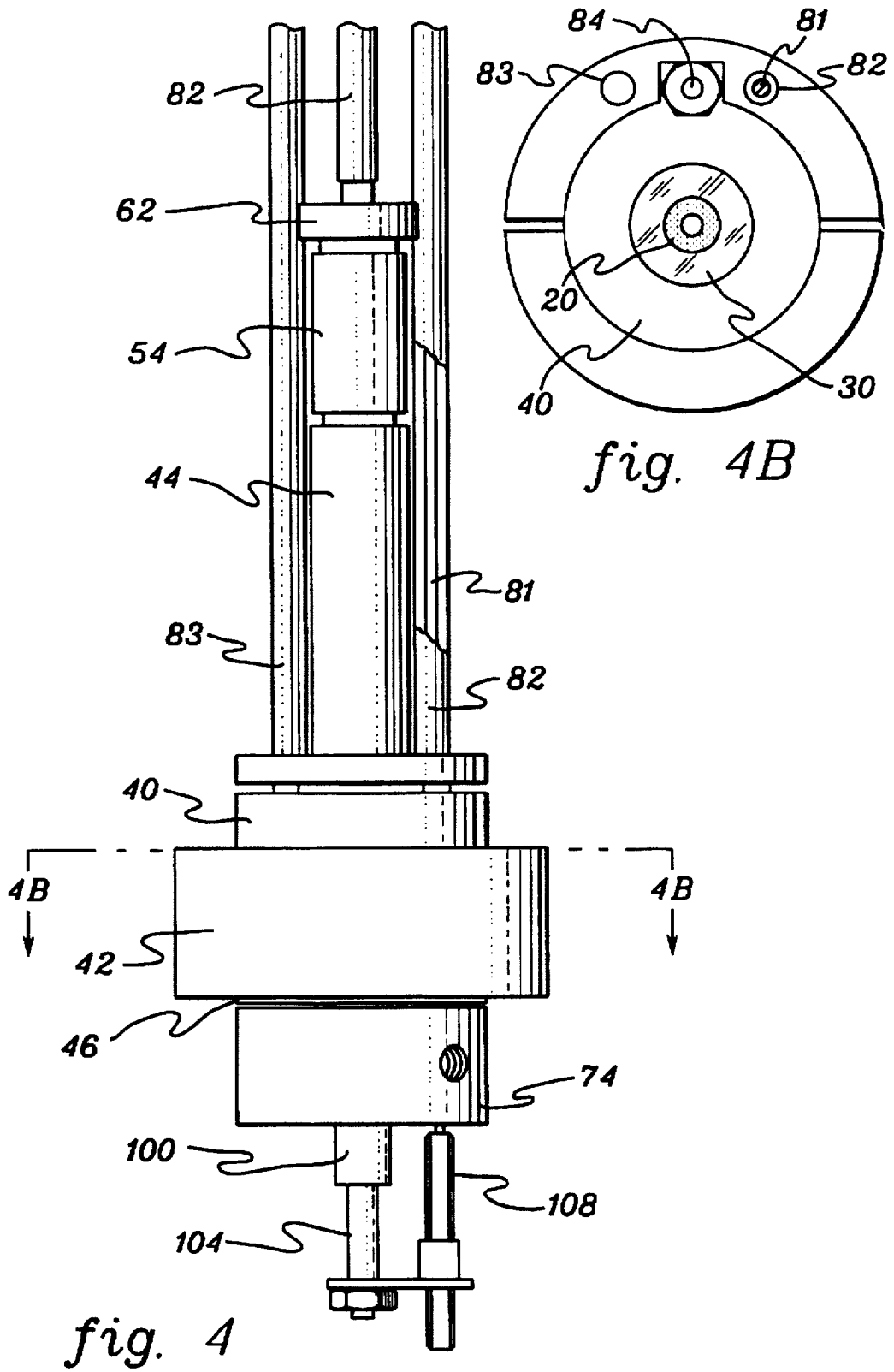
FIG. 4 is a partially cutaway front view of the stopped-flow EPR probe and coupler.
FIG. 4B is a cross-sectional view of the apparatus taken from A, A' of FIG. 4.

As can be seen in FIGS. 1, and 4B, the resonant structure may be substantially surrounded by a protective body 40 which acts to protect the shield 30 and its metallic covering 38 from damage or contamination. A rigid and durable material should be used in the protective body, examples of such materials include plastics such as those sold under the trade names Delrin®, Acido® and Poylpenco®. As can be seen in reference to FIG. 1, the protective body 40 may comprise a durable body that fully encloses the microwave shield 30 with the exception of an opening which allows the capillary 10 and the antenna 92 to extend therethrough. This protective body 40, in connection with an external bracket 42, may also function as a bracket to which other elements, such as the coupler and coupling matching device 100 may be attached.

In reference to FIG. 1, one embodiment of the protective body 40 may include a hollow cylindrical body with the microwave shield 30 disposed therein, an upper collar 44 and lower collar 46, both of which extend into the interior of cylindrical body and lie on said microwave shield 30. The cylindrical body is sized to have an i.d. slightly larger than that of the microwave shield 30 and a length which allows the microwave shield 30 to completely fit within the interior of the protective cylindrical body. For example, in the particular embodiment shown in FIG. 1, the outer cylindrical body may be 25.4 mm in diameter and 26 mm long. The upper collar 44 is sized to have a diameter substantially equivalent to the cylindrical body with an extension of smaller diameter designed to extend within the cylindrical body and lie on the microwave shield 30. The surface of the upper collar extension may have an additional metallic covering 50, such as 0.1 mm thick copper foil 50 (FIG. 2), to provide additional microwave shielding. To further improve the electrical contact of the shielding thin metal gaskets 51, approximately 0.05 mm thick, may be placed between the microwave shield 30 and the metallic foil 50 adjacent the upper collar 44. A brass sleeve 52 may likewise be inserted within the end of the upper lid 44 which lies upon the microwave shield 30 to prevent microwave leaks along the tube direction and also to achieve better sample tube guidance. The capillary 10 will extend through the brass sleeve 52 into the upper collar 44 and, thus, the brass sleeve 52 must have an i.d. sufficient to accept the sample capillary, for example one having a 3 mm o.d., 1 mm i.d., and 4.8 mm long. The upper collar 44 likewise has an opening extending axially through the collar sized to allow the capillary to fully extend therethrough. The upper collar 44 is preferably elongated along the direction of the capillary to accommodate and protect the portion of the sample capillary 10 which protrudes from the microwave shield. This particular design may accommodate 100 mm standard length sample tubes or capillaries.

The portion of the upper collar 44 opposite the end in contact with the microwave shield 30 may provide a seat for a chemically resistant capillary adapter 54. The upper portion of the upper collar may assume any one of numerous configurations which allow the formation of a liquid tight seal between the capillary and other means commonly used to collect capillary outflow. For example, as shown in FIG. 1, the sample capillary 10 may be held in a fixed position within the resonant structure by compression O-ring seals 56, 76. An O-ring compression seal may be used to create a seal between the outlet of the sample capillary 10 and the termination of the chemically resistant exhaust hose 58, such as a hose made of Polyether Ketone (PEEK). A small chemically resistant compression fitting 60 may be inserted between the termination of the exhaust hose 58 and the capillary adapter 54. The threaded insert 62 of the exhaust hose 58 may be screwed onto the capillary adapter 54, whereby the compression fitting 60 compresses the small O-ring 56 (size 001) making a seal around the sample capillary 10. The exact configuration of the upper lid may be altered or designed in accordance with the chosen capillary and "work" space available.

The lower collar 46 is similar to the upper collar 44 in that it is also designed to have a diameter similar to that of the cylindrical protective body and to have an extension of smaller diameter extending within the cylindrical body to the microwave shield 30 such that the microwave shield 30 lies upon the lower collar extension when within the cylindrical body. The lower collar 46 likewise has an opening extending vertically through the body of the lid and a brass sleeve 52 such that a capillary 10 may extend therethrough into the microwave shield 30. In addition, copper foil 50 may be placed upon the extension of the lower collar and a silver gasket 51 upon the foil so that the microwave shield will rest upon the silver gasket 51. A brass sleeve 53 may also be inserted within the extension of the portion lower collar 46 upon which the microwave shield 30 will lie and such that the capillary 10 may extend therethrough.

The lower collar 46 may also be modified to mate with a mixer assembly 70 in a manner such that the mixer housing 72 is tightly clamped and sealed to the lower collar 46. Any one of numerous mixers and mixer housings may be utilized in conjunction with the EPR probe of the present invention. Preferably they are made out of a chemical resistant material such as polyester ketone (PEEK). A preferred mixer is the Wiskind Grid Mixer manufactured by Update Instrument of Madison, Wis. This particular mixer housing contains 4 metal grids (mesh size No. 75) and is centrally positioned between the lower collar 46 and the mixer support 74. In the embodiment shown in FIG. 1 the length of the brass sleeve 53 within the lower collar 46 was changed to 3.5 mm to shorten the distance between the outlet of the mixer assembly 70 and the center of the active volume of the resonator. The bottom part of the lower collar (opposite to the resonant structure) has a cylindrical hole which accommodates the upper part of the mixer housing 72 and a small O-ring 76 (size 001). This O-ring 76 seals the outlet of the mixer and creates a seal around the sample capillary 10. The lower part of the mixer housing 72 may be placed in the cylindrically shaped seat of the mixer support 74, a larger O-ring 78 (size 007) may be used to seal the lower part of the mixer housing 72 to the mixer support 74. Two brass screws may be used to fasten the mixer support 74 to the lower collar 46. As the mixer support 74 is fastened to the lower collar 46, the two O-rings above and below the mixer housing 72 compress thereby sealing the mixer assembly 70. However, one skilled in the art may adapt the lower collar to accommodate any one of numerous mixer assemblies. Chemically inert hoses with threaded terminations and O-ring compression seals may be used to connect the mixer support 74 to the one or more syringe inlets 79. When utilizing two inlets, the two hoses may be oriented in the horizontal plane and the outlets may form an initial "T-Jet" injector inside the mixer support 74. The distance from the outlet of the mixer to the center of the resonator is 12.6 mm within the embodiment of FIG. 1. This distance, which contributes to the total dead volume, can be slightly shortened by one skilled in the art with other appropriate modifications. Standard EPR techniques, other than stopped-flow, do not require a mixer assembly.

Delivery of liquid samples may be monitored by any one of numerous systems known in the art, examples being a controlled syringe ram or infusion pump, compressed air driven systems and hand driven syringes. A preferred syringe ram system is the model 715 syringe ram controller manufactured by Update Instruments, Inc. of Madison, Wis.

Figure 2B:
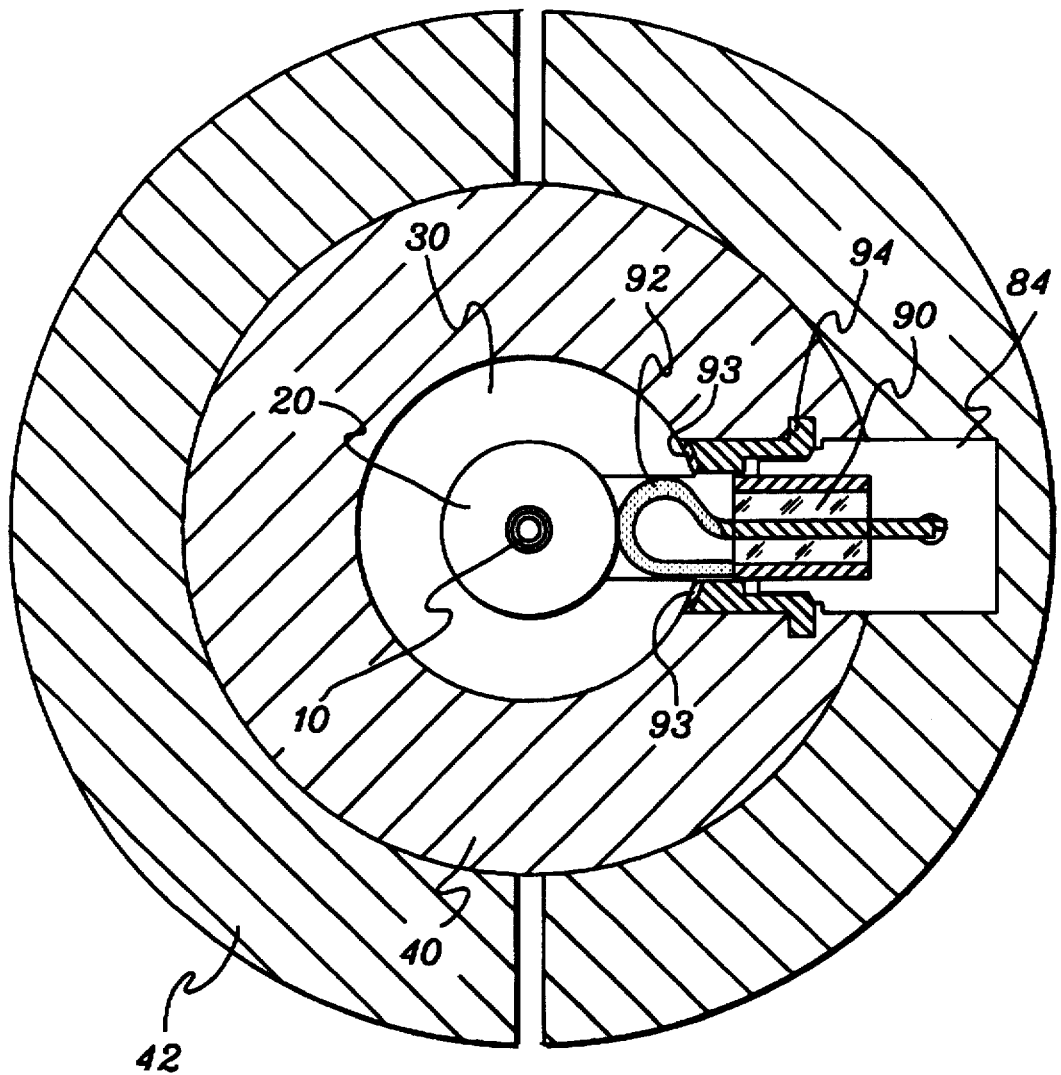
FIG. 2B is a top cross-sectional view of FIG. 1 taken from B, B' for the TE mode.
Figure 2C:
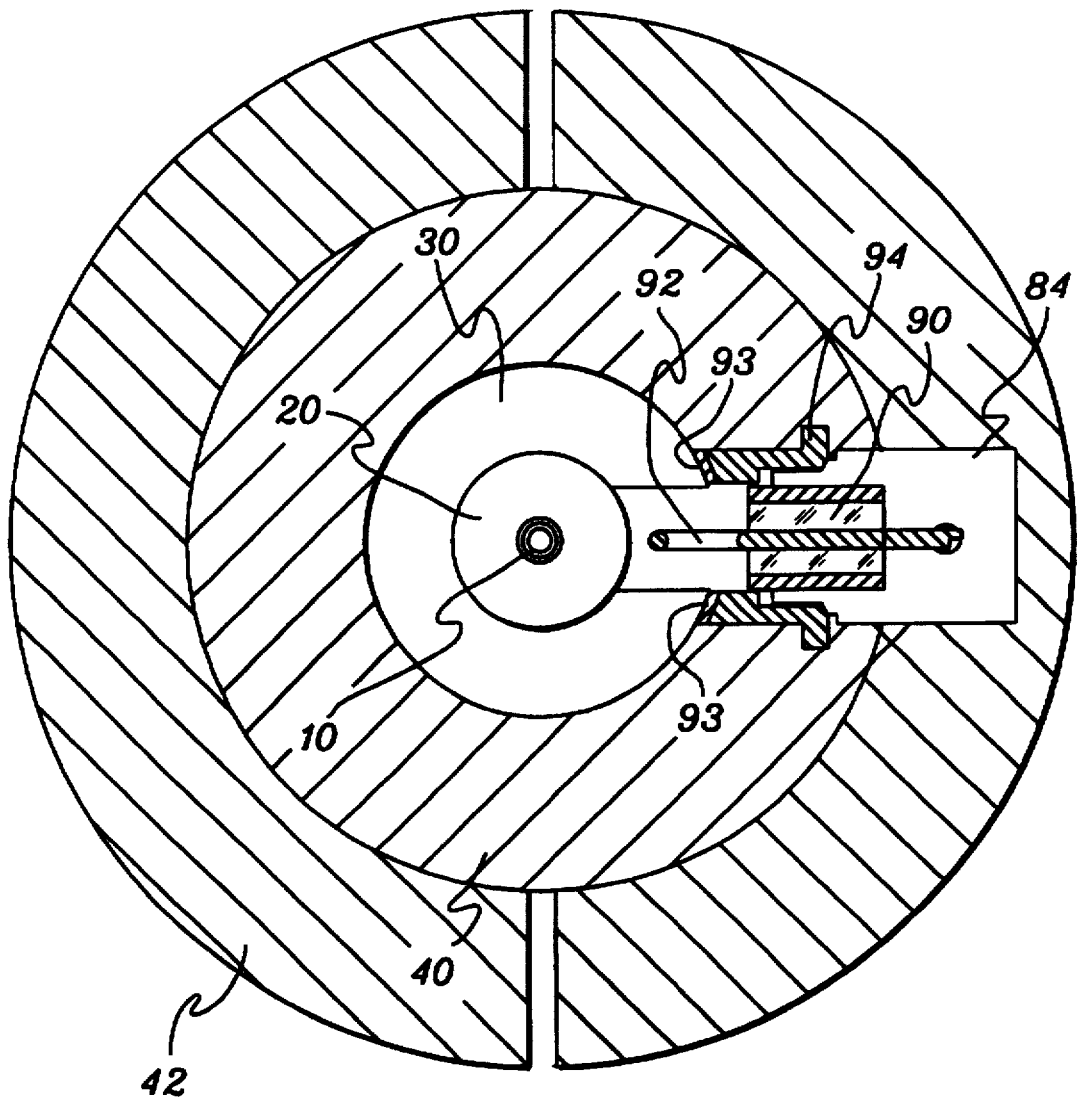
FIG. 2C is a top cross-sectional view of FIG. 1 taken from B, B' for the TM mode.

As best seen in FIG. 2, microwaves are coupled to the resonant structure by the coupler which may comprise an antenna 92, a connector 84, a microwave transmission line 82 and a microwave production source (not shown). The microwaves are directly coupled to the resonant structure via the antenna 92, which extends within the body of the microwave shield 30 adjacent, but not in contact with, either the single resonator 20 (FIG. 3) or spacer 22 (FIG. 3B). The antenna 92 may comprise an extension of the center conductor of a section of semirigid coax 90 which is in turn attached to the center conductor of connector 84. The coupling loop or antenna 92, which is preferably shaped to have a non-linear configuration limited to a single plane, an example being a hook shape (FIG. 2B) having approximately a 3 mm diameter made from 0.6 mm copper wire. The antenna is soldered to both the center conductor and to the copper outer conductor of a 0.141 inch semi-rigid coax 90. The antenna 92 protrudes laterally into the microwave shield 30, preferably through a cylindrical hole (3.6 mm in diameter) drilled in the shield 30 side wall. The position of the antenna may be fixed adjacent to the dielectric resonator 20 or spacer 22, and preferably with its plane oriented perpendicular to the cylindrical axis of the resonant structure (FIG. 2B). However, affixing the antenna in a plane parallel to the cylindrical axis of the resonant structure (FIG. 2C) may also have useful applications. Fixing the plane perpendicular to the cylindrical axis of the resonant structure acts to couple the magnetic component ($H_1$) of the resonator $TE_{01\delta}$ mode whereas orienting the plane of the loop parallel to the cylindrical axis would preferentially excite TM modes. A brass antenna guide 94, having an inner diameter of 4.55 mm, may be used to guide the cylindrical part of the SMA connector and tightly fit the termination of the semi-rigid coax 90 which leads from the SMA connector 84 to the antenna 92. The end of the brass guide 94 for the cylindrical part of the SMA connector in contact with the microwave shield 30 is preferably concave to conform to the side of the shield 30. It is important to have good electrical contact where the coupler joins the resonant structure. Thus, a silver gasket 93 (FIG. 2) may be placed between the coated wall of the microwave shield 30 and the brass guide 94. This silver gasket 93 helps to prevent Q loss and to shield a point where poor electrical contact can lead to microphonics.

Microwaves produced at a distant source (not shown), such as a microwave bridge of an EPR spectrometer, propagate down a microwave transmission line 82 to the connector 84. The transmission line 82 may comprise any suitable material known in the art to reliably propagate microwaves of the selected wavelength, for example when using X-band wavelength, the waveguide may be standard 0.141 inch coaxial cable having an inner conductor of silver plated copper wire, and an outer conductor of copper. As can best be seen in FIG. 1, the microwave transmission line 82 may be connected to a connector 84, an example being a modified SMA (Standard Military A) connector such as the Omni Spectra right angle cable plug, part number 2007-5054-00. The inner conductor of the microwave connector 84, the inner conductor of semi-rigid coax 90 and center conductor 102 of the coupling matching device 100 are electrically inter-connected within connector 84, preferably forming a "T"-shaped joint. It is important to form a good electrical connection between the inner conductor of the semi-rigid coax leading to the coupling loop and the portion of the center conductor in contact with the T-joint. In order to precisely orient this electrical connection a technological hole may be drilled in the back wall of the SMA connector to aid in aligning the three conductors during attachment. This technological hole may be filled once the connection is complete. An external bracket 42 (FIG. 1) may be used to affix the coupler in position adjacent the resonant structure as well as to compress the silver gasket 93 between the microwave shield 30 and the brass antenna guide 94.

The coupling matching device 100 is connected to the coupler 80 at the bottom wall of the connector 84. The center conductor 102, which is the inner conductor of the coaxial line 106, extends from the connector 84 into metallic tubing 106. Within the metallic sleeve is a metallic plunger 104, both of which are preferably made of a non-magnetic metal such as brass, which is sized to tightly fit over the center conductor 102. The plunger is designed to move back and forth within the sleeve 106 along the length of the center conductor 102. The movement of the plunger, thus, modifies the coupling between the resonant structure and coupler by changing the electrical length of the coaxial coupling matching device. Modifying the coupling, by matching the impedance between the antenna and the microwave line allows the optional power to be introduced into the resonant structure without significantly changing $f_o$ of the resonant structure. The preferred length of the plunger displacement is approximately 25 mm which roughly corresponds to ¾λ distance of the transverse electromagnetic (TEM) line. This will typically cover the whole tuning range needed to match impedance when using either high dielectric lossy or standard non-lossy samples. Numerous mechanical means exist for displacing the plunger as shown in FIG. 4, an example being a gear box 108 connected to the plunger 104, alternate means capable of moving a metal plunger are well known in the art.

Having the entire coupling matching device 100 external to the resonator allows the use of a simple and mechanically stable means for changing the coupling. Stopped flow experiments involve rapid sample movement through the sample capillary and the rapid starting and stopping of this flow causes concomitant vibrations. Thus, the coupling and matching structures are preferably remote from the sample capillary to avoid vibration-induced noisy transients. This particular version of the variable short provides a smooth, microphonic free operation and adds sufficient dynamic range to relatively easily match various coupling with different loads. Moreover, it allows one to change the coupling without causing large resonance frequency shifts. separation of coupling and frequency changes means that attaining critical coupling is considerably simplified.

As can be seen in FIGS. 4 and 4A, stainless steel tubings 82 and 83 anchored firmly to bracket 42 enables the EPR probe to be attached to the microwave waveguide output of the microwave bridge. One of the stainless steel tubings may serve as guidance and protection for driving shaft 81 of the coupling matching device 100. The actual microwave connection to the waveguide output of the microwave bridge may be achieved by a standard waveguide-to-coax adapter which connects directly to the coaxial transmission line 82 and a section of the regular WR90 X-Band waveguide.

Since the DR-based EPR probe for stopped flow measurements directly replaces the standard X-Band cavity of the conventional EPR spectrometers. the present invention may easily be combined with existing systems. No significant modifications are required to the microwave bridge nor in the signal detection aspect of the conventional EPR spectrometer.

Figure 5:
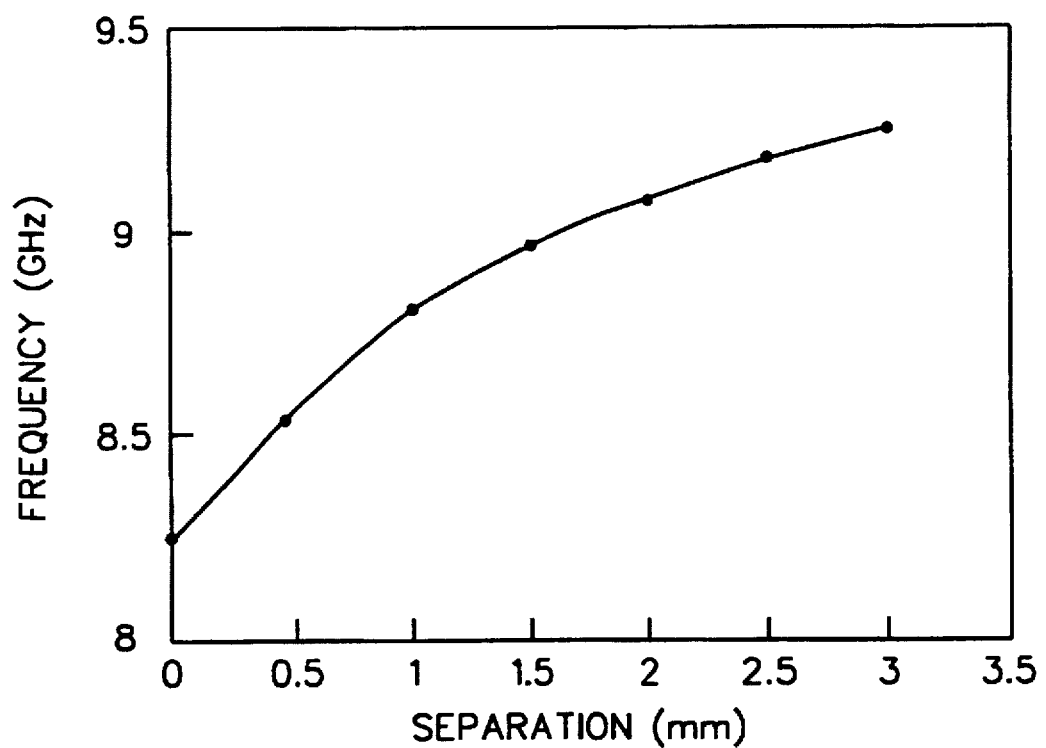
FIG. 5 is a graph displaying resonant frequency as a function of spacing between two stacked dielectric resonators.

The use of multiple dielectric resonators 20 will significantly lower the resonance frequency and, thus, the resonant frequency may tuned by varying the degree of separation between the stacked dielectric resonators 20. For example, a Bruker ER-200 D EPR spectrometer provided frequencies in a 9.05–10.0 GHz region whereas often a single dielectric resonator resonates above 10.0 GHz or else a double stacked pair resonates below 9.0 GHz. However, increasing the distance between the stacked MuRata-Erie dielectric resonators from 0.0 to 1.3 mm increased the resonant frequency in the desired transverse electric ($TE_{01\delta}$) mode from 8.5 GHz to 9.21 GHz. Variation in resonant frequency ($f_o$) in relation to the spacing between two stacked TransTech dielectric resonators can be seen in reference to FIG. 5. Thus, varying the spacing between the dielectric resonators offers a straight forward method of tuning that extends the active length of the dielectric resonator device within the constrains of keeping the active volume for the sample small. However, having a low loss dielectric between the dielectric resonators suppresses transverse magnetic (TM) modes at the expense of the desired $TE_{01\delta}$ mode. The preferred compromise of homogeneity of $H_1$ across the sample and a reasonable 0.7 cm active length utilizes the double stacked dielectric resonator configuration having a separation of 1.3 mm to 1.5 mm.

Using a standard microwave sweeper, such as the Microline swept oscillator Model 64X1, measurements of the resonant frequency ($f_o$) , unloaded Q and loaded Q of the various DR configurations may be made. This will allow calculation of the desired distance between the stacked resonators. Thereafter, the resonant structure and surrounding bodies may be easily machined, pieced together and inserted into the apparatus. Thereafter, the microwave generator is turned on and the sample inserted into the capillary via the syringe inlets and the mixer. Once the sample is in the active volume the coaxial coupling matching device may be adjusted to obtain critical coupling. Movement of the Update RAM forces sample from the syringes to the hoses, then to the mixer, and finally, to the capillary in the active volume of the resonator. Then the EPR spectrometer receives the EPR signal from the sample.

Due the use of the high dielectric material of the dielectric resonator in conjunction with the configuration of the dielectric resonators the microwave field is redistributed such that an increased magnetic energy density ($H_1$) is experienced in the sample volume since in the $TE_{01\delta}$ mode this resonator will have a vertically directed $H_1$ extending through its center whereas the electric field ($E_1$) is primarily confined within the dielectric itself. This redistribution and separation of the $E_1$ and $H_1$ components helps yield significantly larger EPR signals and a greater Q for an aqueous sample.

While the invention has been particularly shown and described with reference to preferred embodiments thereof, it would be well understood by those skilled in art that other changes on a particular form and details may be made therein without departing from the spirit and scope of the invention.

What is claimed is:

1. An electron paramagnetic resonance probe comprising:
   a resonant structure;
   a coupler;
   a coupling loop disposed between said resonant structure and said coupler; and
   a remote coupling matching device operatively engaged to said coupler located adjacent said coupling loop and external to said resonant structure wherein resonant frequency of the resonant structure remains substantially unchanged upon modification of coupling between the resonant structure and the coupler.

2. The electron paramagnetic resonance probe of claim 1 wherein said coupling matching device comprises a coaxial waveguide of adjustable length.

3. The electron paramagnetic resonance probe of claim 2 wherein said coupling loop comprises an antenna, said coupler comprises said antenna, connector and microwave feed line and wherein said coupler couples microwaves to said resonant structure.

4. The electron paramagnetic resonance probe of claim 3 wherein said connector comprises a three-way connection between said microwave feed line, said waveguide and said antenna.

5. The electron paramagnetic resonance probe of claim 1 further comprising a protective body surrounding said resonant structure.

6. The electron paramagnetic resonance probe of claim 1 wherein said resonant structure comprises a resonator surrounded by a microwave shield.

7. The electron paramagnetic resonance probe of claim 1 further comprising: a mixer assembly in connection with a capillary, wherein said capillary extends through said resonant structure.

8. The electron paramagnetic resonance probe of claim 1 wherein said remote coupling matching device and said coupler are removably coupled to said resonant structure.

9. An electron paramagnetic resonance probe comprising:
   a resonant structure;
   a coupler; and
   a remote coupling matching device operatively engaged to said coupler whereby resonant frequency of the resonant structure remains substantially unchanged upon modification of coupling between the resonant structure and the coupler, said remote coupling matching device comprising a coaxial waveguide of adjustable length, and said coaxial waveguide of adjustable length comprising: a hollow tube, an inner conductor disposed in said tube, electrically connected to said coupler, and a metallic plunger surrounding said conductor and axially moveable along a length of said conductor.

10. An electron paramagnetic resonance probe of claim 9 wherein said coupler comprises:

an antenna comprising an inner conductor of coaxial cable;

a coupling matching device comprising the inner conductor of the coaxial waveguide; and a microwave feed line, a portion of which comprises coaxial cable having an inner and outer conductor wherein the inner conductors of the coaxial cable of said antenna, waveguide and microwave feed line are electrically connected to form a three-arm connection.

11. The electron paramagnetic resonance probe of claim 9 wherein said resonant structure comprises a resonator surrounded by a microwave shield.

12. The electron paramagnetic resonance probe of claim 9 further comprising: a mixer assembly in connection with a capillary, wherein said capillary extends through said resonant structure.

* * * * *